United States Patent [19]
Lehmann et al.

[11] Patent Number: 6,027,605
[45] Date of Patent: Feb. 22, 2000

[54] PLASMA ETCHING APPARATUS AND METHOD AND APPARATUS FOR VERIFYING A WAFER

[75] Inventors: Mark D. Lehmann, Chandler; Dorman Raines, Campe Verde; Charles A. Stamps, Mesa, all of Ariz.

[73] Assignee: Raines Technologies, Inc., Tempe, Ariz.

[21] Appl. No.: 09/083,596

[22] Filed: May 22, 1998

[51] Int. Cl.⁷ .............................. C23F 1/02; B05C 11/00; B23Q 3/00; B23Q 3/08; B25B 11/00
[52] U.S. Cl. .................... 156/345; 118/500; 118/712; 118/728; 269/20; 269/21; 269/23; 345/345 PW; 345/345 WH
[58] Field of Search ...................... 118/500, 728, 118/712; 156/345; 269/20, 21, 23; 345/345 PW, 345 WH

[56] References Cited

U.S. PATENT DOCUMENTS

| | | | |
|---|---|---|---|
| 4,682,928 | 7/1987 | Foulke et al. | 414/416 |
| 5,695,568 | 12/1997 | Sinha et al. | 118/729 |

*Primary Examiner*—Edna Wong
*Attorney, Agent, or Firm*—Parsons & Goltry; Roberts A. Parsons; Michael W. Goltry

[57] ABSTRACT

Wafer verifying apparatus for receiving a wafer thereagainst and for verifying the wafer, wafer verifying apparatus comprising a fixture including a stage for receiving thereagainst a surface of the wafer, a vacuum assembly for effecting a vacuum coupling of the surface of the wafer to the stage, and sensor apparatus for accepting the wafer in the presence of a vacuum couple of the surface of the wafer against the stage and for rejecting the wafer absent a vacuum couple of the surface of the wafer against the stage.

4 Claims, 4 Drawing Sheets

PLASMA ETCHING APPARATUS AND METHOD AND APPARATUS FOR VERIFYING A WAFER

FIELD OF THE INVENTION

This invention relates generally to the field of plasma etching apparatus and, more particularly, to improved plasma etching apparatus and methods and apparatus for verifying wafers for plasma etching processes.

BACKGROUND OF THE INVENTION

Plasma etching apparatus are well known for etching wafers such as, for instance, semiconductor wafers. Typical plasma etching apparatus generally comprise a plasma chamber for containing a plasma field, an electrode mounted in the plasma chamber, a wafer feed assembly for feeding wafers to the electrode for plasma etching and a wafer retrieval assembly for retrieving etched wafers from the plasma chamber. For exemplary etching, it is important for the wafer to rest normal and flush against the electrode. However, because manufacturing flaws can result in wafers having surface irregularities, flawed wafers subject to plasma etching can become irreparably damaged. Because the prior art provides little to solve this long-felt problem in the art, the occasion for certain new and useful improvements proves necessary.

Accordingly, it would be highly desirable to provide improved plasma etching apparatus and methods and apparatus for verifying wafers for plasma etching processes.

It is a purpose of the present invention to provide new and improved apparatus for verifying wafers that is easy to implement with existing plasma etching technology.

It is another purpose of the present invention to provide new and improved apparatus for verifying wafers that is easy to construct.

It is still another purpose of the present invention to provide new and improved apparatus for verifying wafers that is easy to use.

It is a further purpose of the present invention to provide new and improved apparatus for verifying wafers that is inexpensive.

It is still a further provision of the present invention to maximize yield in plasma etching processes.

It is yet still a further purpose of the present invention to provide a new and improved method of verifying wafers that is highly efficient and easy to implement.

It is another provision of the present invention to enhance the functional utility of plasma etching apparatus.

It is still another provision of the present invention to limit waste of flawed wafers in plasma etching processes.

It is yet still another provision of the present invention to substantially eliminated unproductive operation time during plasma etching processes.

SUMMARY OF THE INVENTION

The above problems and others are at least partially solved and the above purposes and others are realized in improved plasma etching apparatus and methods and apparatus for verifying wafers for plasma etching processes. In a particular embodiment, the present invention includes wafer verifying apparatus for receiving a wafer thereagainst and for verifying the wafer, wafer verifying apparatus comprising a fixture including a stage for receiving thereagainst a surface of the wafer, means for effecting a vacuum coupling of the surface of the wafer to the stage, and sensor apparatus for accepting the wafer in the presence of a vacuum couple of the surface of the wafer against the stage and for rejecting the wafer absent a vacuum couple of the surface of the wafer against the stage. The means for effecting a vacuum coupling of the surface of the wafer to the stage may comprises a channel leading to an opening formed through the stage in substantial opposition to the surface of the wafer received against the stage, and means for introducing a vacuum into the channel for effecting vacuum coupling of the surface of the wafer to the stage.

In accordance with a preferred embodiment, the means for introducing a vacuum into the channel may comprise a vacuum coupled with the channel in vacuum communication. Furthermore, the sensor apparatus may comprise a pressure sensor sensorially coupled to monitor pressure within the channel, and a controller coupled in communication with the pressure sensor for accepting the wafer in the presence of a sub-atmospheric condition in the channel as sensed by the pressure sensor, and for rejecting the wafer absent the presence of the sub-atmospheric condition in the channel as sensed by the pressure sensor.

In accordance with a preferred method of verifying a wafer for processing such as for plasma etching processes, included are the steps of providing a fixture having a stage, placing a surface of a wafer against the stage, effecting a vacuum coupling of the surface of the wafer to the stage, verifying a vacuum couple of the surface of the wafer to the stage, and one of the steps of accepting the wafer in the presence of a vacuum couple of the surface of the wafer against the stage, and rejecting the wafer absent a vacuum couple of the surface of the wafer against the stage.

In a specific example, the step of effecting a vacuum coupling of the surface of the wafer to the stage may further include the steps of providing a channel leading to an opening formed through the stage in substantial opposition to the surface of the wafer received against the stage, and introducing a vacuum into the channel for effecting vacuum coupling of the surface of the wafer to the stage. To introduce a vacuum into the channel may include the steps of providing a vacuum, coupling the vacuum to the channel in vacuum communication, and actuating the vacuum.

To determine a vacuum couple of the surface of the wafer to the stage may include the steps of establishing a baseline pressure for the channel, observing a subject pressure within the channel, and comparing the subject pressure with the baseline pressure. Observing the subject pressure may include providing a pressure sensor and coupling the pressure sensor to monitor and display the pressure within the channel. With the subject pressure being less than or equal to the baseline pressure, the step of accepting the wafer may further include the step of leaving the wafer on the stage for processing, wherein with the subject pressure being greater than the baseline pressure, the step of rejecting the wafer may further include the step of removing the wafer from the stage.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DETAILED DESCRIPTION OF A PREFERRED EMBODIMENT

The present invention provides, among other things, improved plasma etching apparatus and methods and apparatus for verifying wafers for plasma etching processes. Preferred embodiments of the present invention are easy to implement with existing plasma etching technology and prove exemplary not only for decreasing unproductive operation time during plasma etching processes, but also for increasing the functional utility of conventional plasma etching apparatus.

Figures 1, 2:
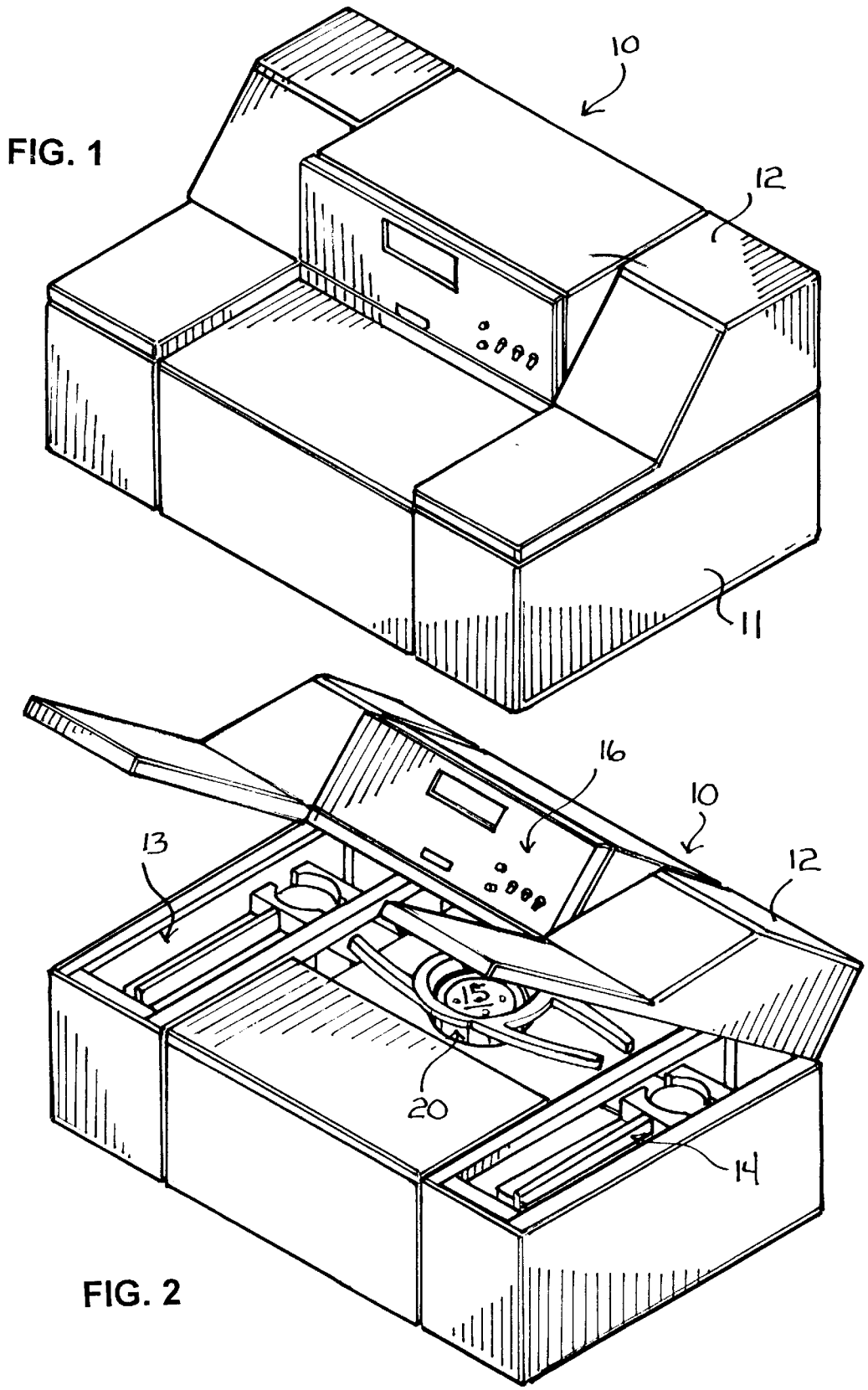
FIG. 1 illustrates a perspective view of plasma etching apparatus, in accordance with the present invention.
FIG. 2 illustrates a perspective view of plasma etching apparatus of FIG. 1 and further showing a lid thereof as it would appear open exposing a wafer feed assembly, a wafer retrieval assembly and a chuck assembly for receiving and supporting wafers from the wafer feed assembly.

Turning now to the drawings, in which like reference characters indicate corresponding elements throughout the several views, attention is first directed to FIG. 1 illustrating a perspective view of plasma etching apparatus 10, in accordance with the present invention. As best shown in FIG. 2, plasma etching apparatus 10 comprises a housing 11 having a hinged lid 12 shown as it would appear in an open position and containing a wafer feed assembly 13, a wafer retrieval assembly 14 and a chamber 15 for containing a plasma field.

In operation, wafers, such as semiconductor wafers, may be fed by wafer feed assembly 13 individually into chamber 15. Upon receipt into chamber 15, chamber 15 may be enclosed and filled with a gas or gases. From the gas or gases, a plasma field may be produced by, for instance, exposing the gas or gases to an electric field. The plasma field operates to etch the wafer in a predetermined and pre-specified pattern normally consistent with a pattern formed on the wafer prior to exposure to the plasma field. After this etching process is complete, the plasma field may be evacuated from chamber 15, such as with a vacuum, chamber 15 opened and the etched wafer removed from chamber 15 by wafer retrieval assembly 14. This process may be repeated as necessary, either automatically or manually, for etching consecutive wafers. It will be generally understood that plasma etching apparatus 10 includes conventional electrical and processing circuitry and necessary and conventional operational controls generally designated at 16 for effecting the actuation and operation of plasma etching apparatus 10 and various components thereof for normal operation, details of which will not be herein discussed as they will readily occur to the skilled artisan.

Wafers fed individually into chamber 15 for etching are received against and supported by a chuck assembly 20. With attention directed to FIG. 3 illustrating an exploded perspective view of chuck assembly 20, chuck assembly 20 generally comprises a bell housing 21 mounted to a cylinder assembly 22 for effecting movement of bell housing 21 in reciprocal directions as generally indicated by the double arrowed line A, a base plate 23 carried in bell housing 21 and a fixture 24 carried in bell housing 21 atop base plate 23.

Figure 3:
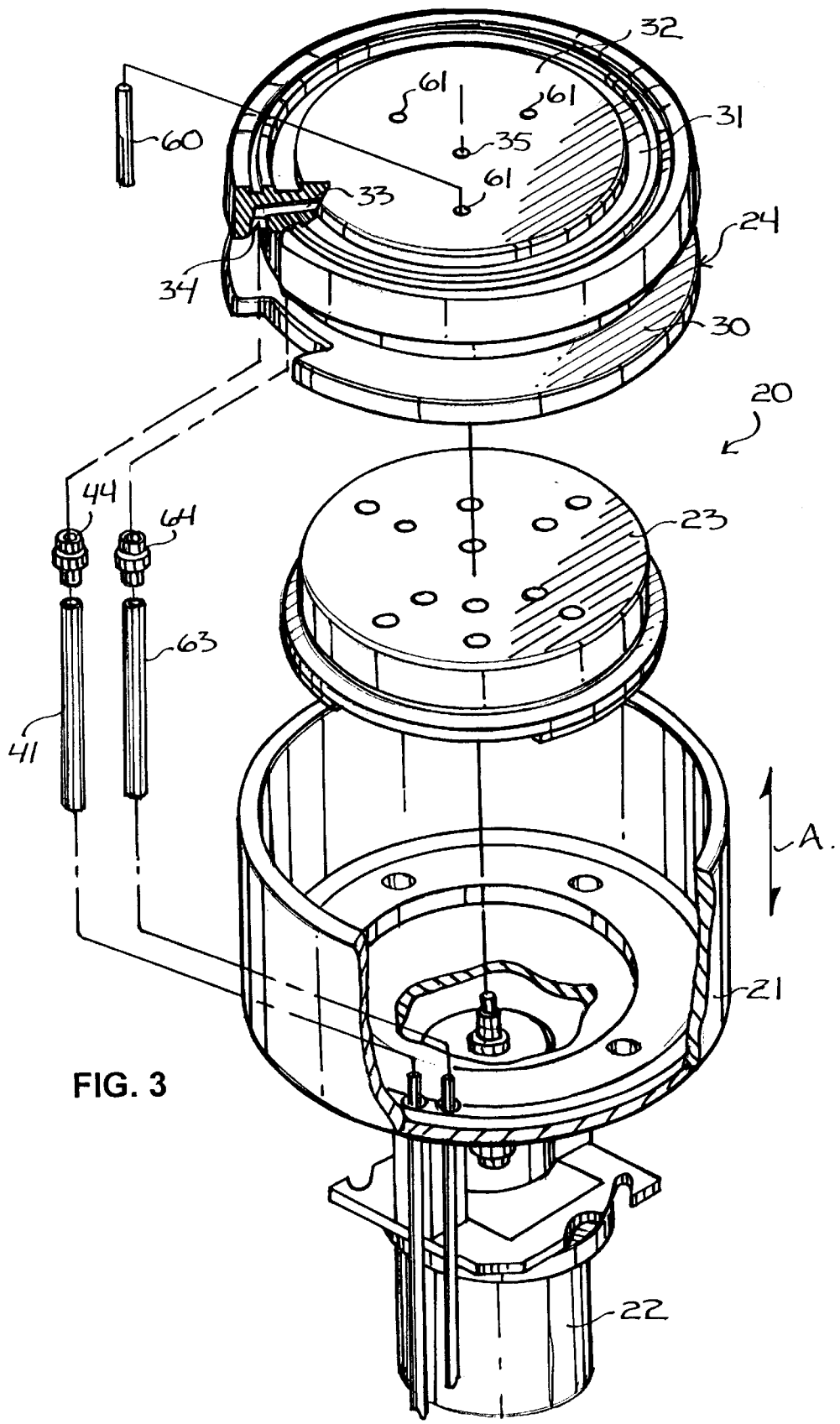
FIG. 3 illustrates an exploded perspective view of the chuck assembly of FIG. 2.
Figure 5:
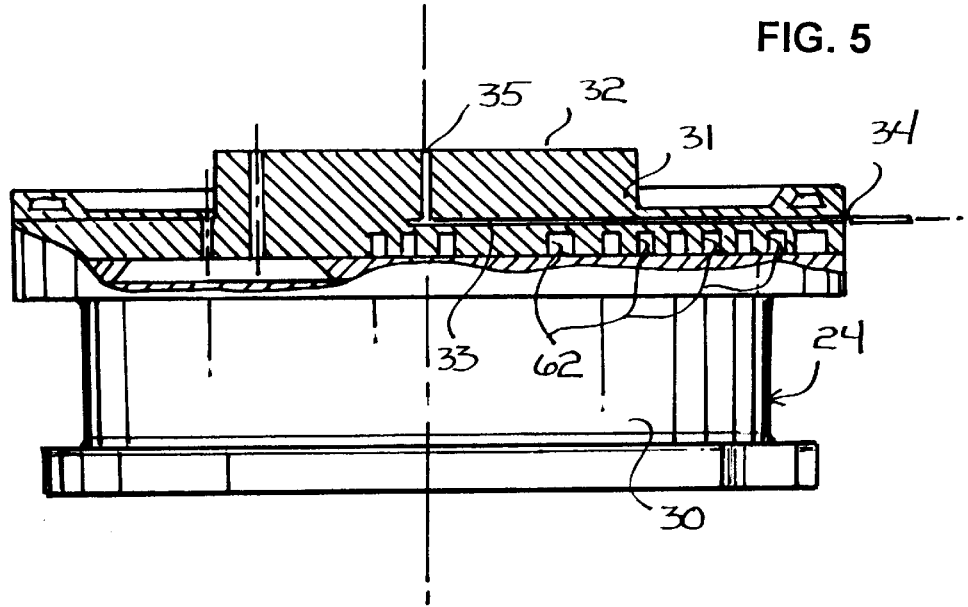
FIG. 5 illustrates a side elevational view of a fixture of the chuck assembly of FIG. 3, the fixture including a stage support with portions thereof being broken away for the purposes of illustration.

In accordance with the present invention, and with continuing reference to FIG. 3 and additional reference to FIG. 5 illustrating a side elevational view of fixture 24, fixture 24 comprises an electrode including an electrode body 30 and a stage support 31 carried by electrode body 30, stage support 31 having a stage 32 for receiving thereagainst a surface of a wafer for plasma etching processes in chamber 15 (not shown in FIGS. 3 and 5). Although stage support 31 is shown as a separate element, it may be formed integral with electrode body 30 if desired. Formed in stage support 31 is a channel 33 leading from an opening 34 formed, for instance, through stage support 31 to an opening 35 formed through stage 32.

Figure 4:
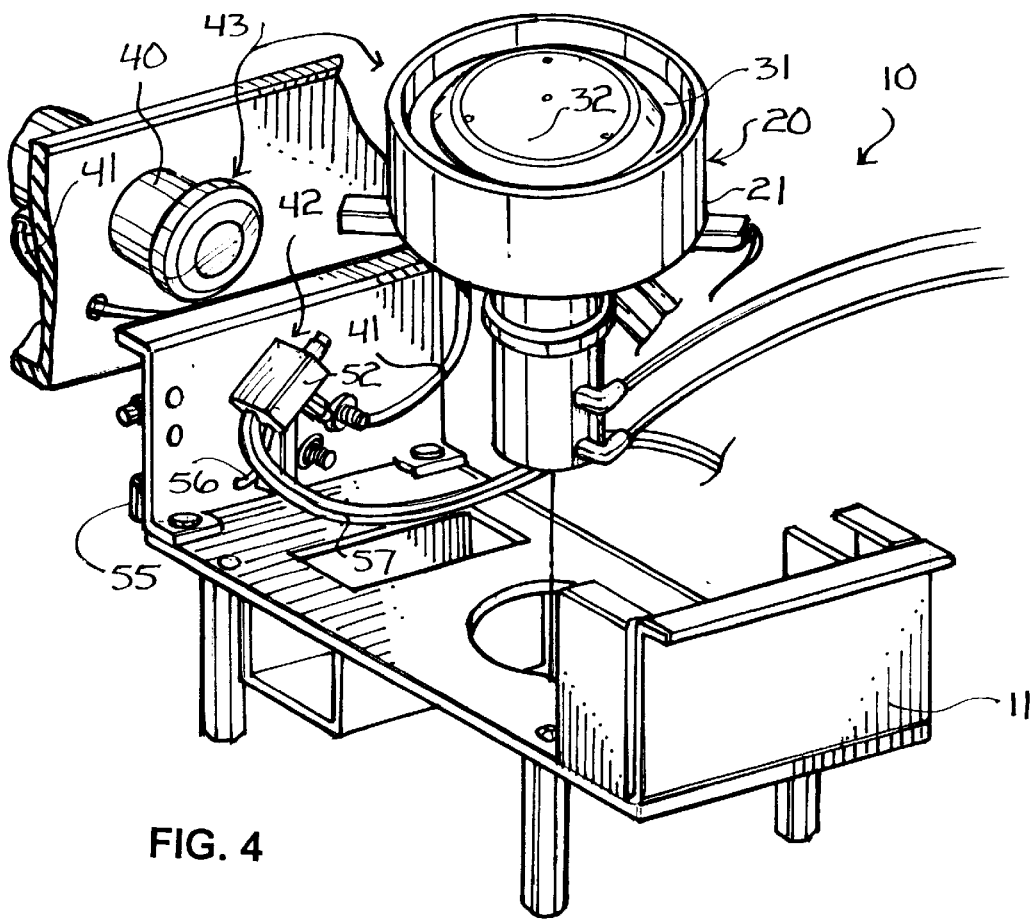
FIG. 4 illustrates a perspective view of plasma etching apparatus of FIG. 1, portions thereof being broken away for the purposes of illustration.
Figure 6:
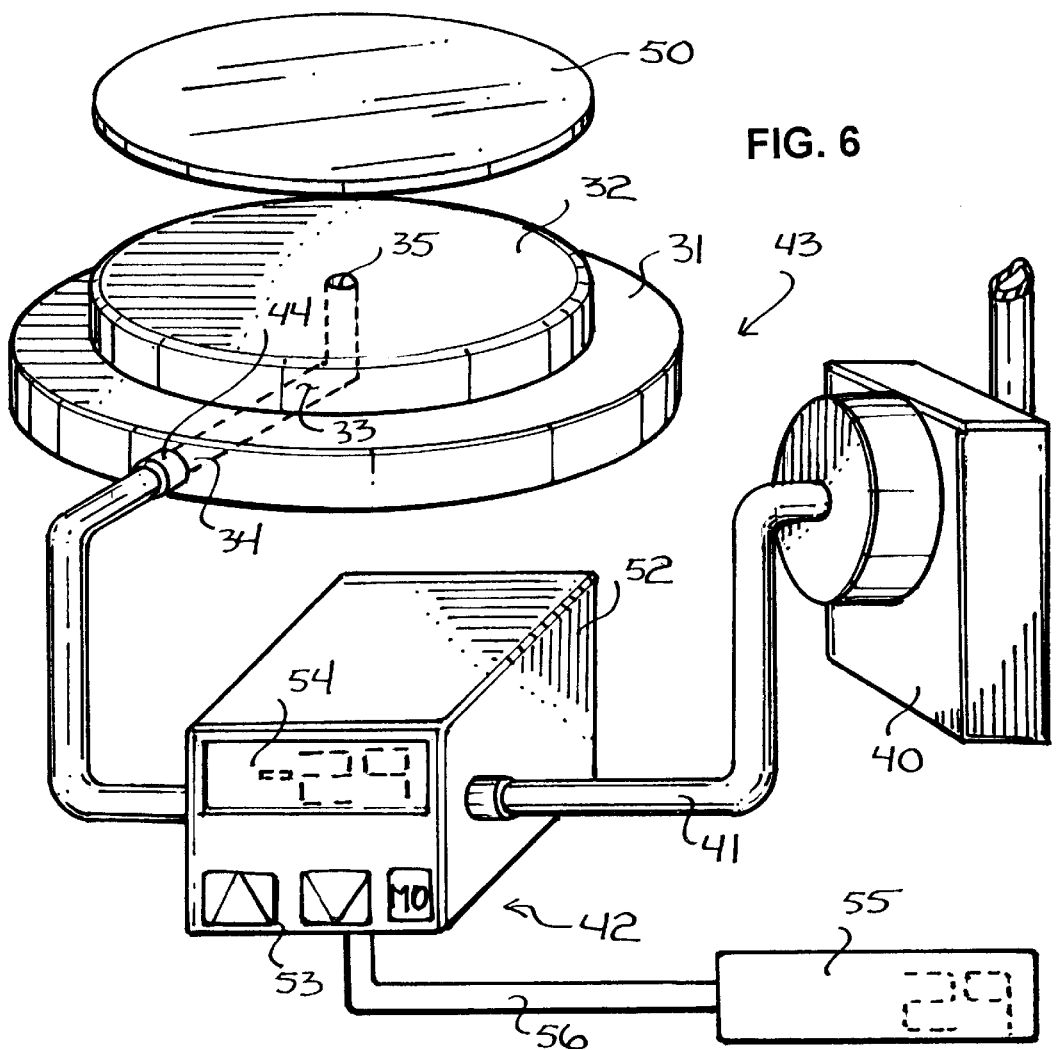
FIG. 6 illustrates a schematic representation of wafer verifying apparatus of plasma etching apparatus of FIG. 1, wafer verifying apparatus including the stage support of the fixture of FIG. 4 and having a stage for receiving a wafer thereagainst, a vacuum coupled with the stage in vacuum communication for effecting vacuum coupling of the wafer to the stage and sensor apparatus for verifying vacuum coupling of the wafer to the stage.

With attention directed to FIG. 4 illustrating a perspective view of plasma etching apparatus 10 with portions thereof broken away for the purposes of illustration, shown is stage support 31 in addition to a vacuum 40 and sensor apparatus 42 together generally comprising wafer verification apparatus 43 of the present invention. With continuing reference to FIG. 4 and additional reference to FIG. 6 illustrating a schematic representation of wafer verification apparatus 43, vacuum 40 is carried by housing 11 and is coupled with opening 34 (not shown in FIG. 4) via vacuum conduit 41 in vacuum communication. In accordance with a preferred embodiment, sensor apparatus 42 is interfaced with vacuum conduit 41 and sensorially coupled to monitor the pressure within channel 33. As shown in FIGS. 3 and 6, vacuum conduit 41 is coupled in vacuum communication with opening 34 via fitting 44.

In operation, stage 32 is operative for receiving thereagainst a surface 50 of a wafer 51, of which may comprise a semiconductor wafer or the like desired to be exposed to a plasma field in chamber 15 for etching. To insure wafer 51 does not become damaged when exposed to a plasma field in chamber 15, it is important for surface 50 to rest flush against stage 32. Thus, it is important not only to verify whether surface 50 is flush against stage 32, but also to accept wafer 51 for etching if surface 50 is flush with stage 32 and to reject wafer 51 for etching if surface 50 is not flush with stage 32. If surface 50 of wafer 51 is flush with stage 32, accepting wafer 51 generally includes leaving wafer 51 on stage 32 for plasma etching. However, if surface 50 of wafer 51 is not flush with stage 32, rejecting wafer 51 generally includes removing wafer 51 from stage 32 for disposal by, for instance, wafer retrieval assembly 14 shown in FIG. 1.

Figure 7:
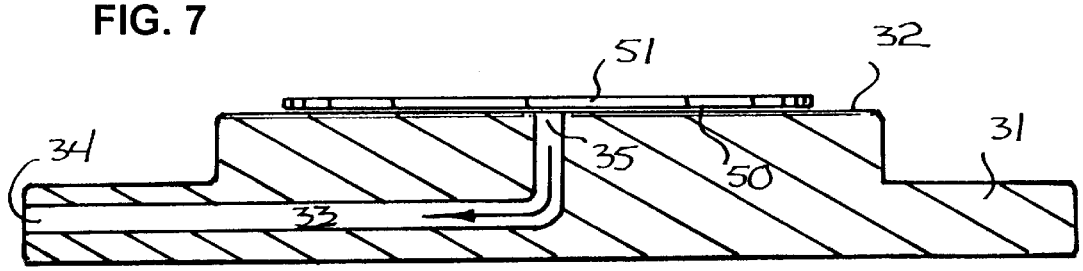
FIG. 7 illustrates a vertical sectional view of the stage support of FIG. 6 and a wafer as it would appear properly received against the stage.
Figure 8:
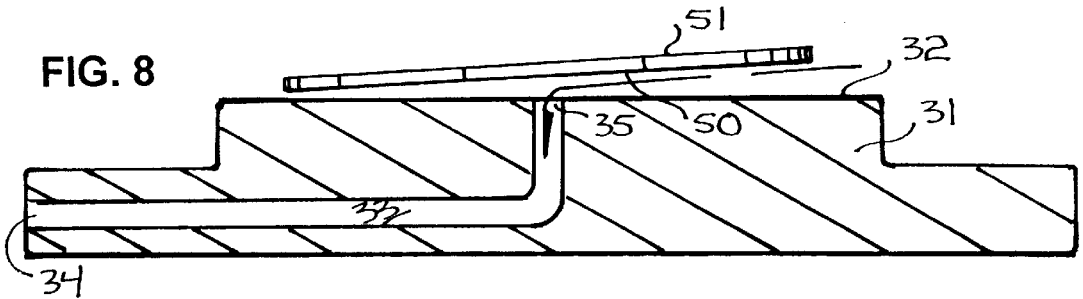
FIG. 8 illustrates a vertical sectional view of the stage support of FIG. 6 and a wafer as it would appear improperly received against the stage.

To verify whether surface 50 of wafer 51 is flush against stage 32 prior to etching and to one of accept and reject wafer 51 accordingly, vacuum 40 may be actuated for introducing a vacuum into vacuum conduit 41 and for introducing a vacuum into channel 33 for effecting a vacuum coupling of surface 50 of wafer to or otherwise against stage 32. If vacuum coupling occurs and opening 35 is occluded or otherwise obstructed by surface 50 of wafer opposing opening 35, the pressure in channel 33 will drop and reside at a point somewhere below atmospheric pressure indicating generally that surface 50 is flush with stage 32 as shown in FIG. 7. If vacuum coupling fails to occur indicating that surface 50 of wafer 51 is not flush with stage 32 as shown substantially in FIG. 8, the pressure in channel 33 will remain substantially at atmospheric pressure.

To monitor the pressure within channel 33, sensor apparatus 42 may comprise a pressure sensor 52 sensorially coupled for actuation to monitor pressure within channel 33, pressure sensor 52 having conventional operational controls 53 and a display 54 for displaying pressure readings taken from channel 33 as shown in FIG. 6. Pressure sensor 52 is of a conventional variety well known throughout the art. Therefore, further details of pressure sensor 52 will not be addressed as they will readily occur to the skilled artisan. In the presence of a sub-atmospheric pressure condition in channel 33 as sensed and displayed by pressure sensor 52, plasma etching apparatus 10 may be actuated for enclosing chamber 15, producing a plasma field in chamber 15 to effecting etching of wafer 51, for evacuating the plasma field from chamber 15, for opening chamber and for removing wafer 51 from stage 32 after etching by, for instance, wafer retrieval assembly 14 shown in FIG. 1.

It will be generally understood that although any pressure in channel 33 below atmospheric pressure may indicate that surface 50 is generally flush with stage 32, a desired sub-atmospheric pressure condition or baseline pressure may be chosen at a predetermined value above which the wafer will be rejected and at or below which the wafer will be accepted.

Actuation of plasma etching apparatus 10 including the operation of wafer feed assembly 13, wafer retrieval assembly 14, vacuum 40 and pressure sensor 52 may, if desired, be carried out manually. As an alternative, the present invention may be committed to automatic operation and control. Regarding automatic operation, the present invention may further include a controller 55 of sensor apparatus 42 and coupled or otherwise interfaced with pressure sensor 52 via interface interconnection 56 for communicating with and automatically and selectively actuating wafer feed assembly 13, wafer retrieval assembly 14, vacuum 40, pressure sensor 52 and for actuating plasma etching apparatus 10 for plasma etching processes. Controller 55 may be of a conventional variety and provided with necessary processing and data or signal communication algorithms for receiving pressure data from pressure sensor 52 and for communicating with and selectively actuating wafer feed assembly 13, wafer retrieval assembly 14, vacuum 40, pressure sensor 52 and for actuating plasma etching apparatus 10 for plasma etching processes. Consistent with the foregoing, a predetermined baseline pressure may be entered into controller 55 if desired for controlling the operation of plasma etching apparatus 10 consistent with preceding discussions. During operation in this regard, controller 55 may operate to compare a subject pressure reading in channel 33 as sensed by pressure sensor 52 with the baseline pressure to either accept the wafer if the subject pressure is equal to or less than the baseline pressure, or reject the wafer if the subject pressure is greater than the baseline pressure.

Regarding FIG. 4, it will be generally understood that cylinder assembly 22 is conventional, hydraulically operated and may be actuated, either manually or by controller 55 of which may be coupled for selectively actuating cylinder assembly 22 via interface interconnection 57, for moving bell housing 21, base plate 23 and fixture 24 in reciprocal directions between a first position for allowing wafers to be placed individually against stage 32 by wafer feed assembly 13 and a second position for enclosing chamber 15 by bell housing 21 and a surface of, for instance, hinged lid 12 shown in FIG. 1. Once enclosed, chamber 15 may be filled with one or more gases and transformed into plasma by exposing the one or more gases to an electric field by, for instance, energizing fixture 24 and, more particular, electrode body 30 of fixture 24. After the etching process is complete, plasma in the chamber may be evacuated and cylinder assembly 22 subsequently actuated, either manually or by controller 55, for moving bell housing 21 from the second position to the first position to open chamber 15 to permit removal of the etch wafer by, for instance, wafer retrieval assembly 14. Although plasma etching apparatus 10 may be equipped with a vacuum especially adapted for evacuating chamber 15 after each etching operation, vacuum 40 may be adapted for carrying out the evacuation operation if so desired.

In summary, the present invention provides exemplary plasma etching apparatus and associated methods and apparatus for verifying wafers for plasma etching processes. The implementation of effecting a vacuum couple of a wafer to stage 32 and of monitoring the pressure within channel 33 to determine the existence of a vacuum couple is highly efficient, extremely cost effective and suitable for allowing not only the easy and inexpensive manufacture of new plasma etching apparatus, but also the retrofitting of existing plasma etching apparatus.

The present invention has been described above with reference to a preferred embodiment. However, those skilled in the art will recognize that changes and modifications may be made in the described embodiments without departing from the nature and scope of the present invention. For instance, although only one channel has been shown for communicating a vacuum to stage for effecting vacuum coupling of a wafer against stage 32, a plurality of such channels may be implemented if so desired. Furthermore, and as shown in FIG. 3, base plate 23 may be fitted with pogo pins 60 (only one shown) receivable into and through apertures 61 formed through stage support 31 and movable for pushing wafers away from stage 32 after etching for easy removal. To cool fixture 24 during plasma etching processes, and with attention directed to FIG. 5, stage support 31 may be provided with a network of interconnected canals 62 formed therein in opposition to stage 32 and coupled in fluid communication to a cooling fluid source via conduit 63 shown in FIG. 3. During operation, fluid, such as water or a selected coolant, may be communicated to the network of interconnected canals 62 for cooling stage support 31 during operation of plasma etching apparatus 10 as desired. As shown in FIG. 3, conduit 63 may be coupled in fluid communication with the network of interconnected canals 62 via fitting 64.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

We claim:

1. Plasma etching apparatus, comprising:

a plasma chamber for containing a plasma field;

a fixture mounted in the plasma chamber and having a stage for receiving thereagainst a surface of a wafer;

means for effecting a vacuum coupling of the surface of the wafer to the stage;

sensor apparatus for accepting the wafer in the presence of a vacuum couple of the surface of the wafer against the stage and for actuating the plasma chamber for creating and exposing the wafer to a plasma field for etching the wafer, and for rejecting the wafer absent a vacuum couple of the surface of the wafer against the stage.

2. Plasma etching apparatus of claim 1, wherein the means for effecting a vacuum coupling of the surface of the wafer to the stage comprises:

a channel leading to an opening formed through the stage in substantial opposition to the surface of the wafer received against the stage; and means for introducing a vacuum into the channel for effecting vacuum coupling of the surface of the wafer to the stage.

3. Plasma etching apparatus of claim 2, wherein the means for introducing a vacuum into the channel comprises a vacuum coupled with the channel in vacuum communication.

4. Plasma etching apparatus of claim 2, wherein the sensor apparatus comprises:

a pressure sensor sensorially coupled to monitor pressure within the channel; and a controller coupled in communication with the pressure sensor for accepting the wafer in the presence of a sub-atmospheric condition in the channel as sensed by the pressure sensor, and for rejecting the wafer absent the presence of the sub-atmospheric condition in the channel as sensed by the pressure sensor.

* * * * *